(12) United States Patent
Lin et al.

(10) Patent No.: US 7,635,417 B2
(45) Date of Patent: Dec. 22, 2009

(54) SEMICONDUCTOR APPARATUS AND CLEANING UNIT THEREOF

(75) Inventors: Chien-Fang Lin, Tainan (TW); Jen-Chih Lu, Tainan (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 348 days.

(21) Appl. No.: 11/418,290

(22) Filed: May 5, 2006

(65) Prior Publication Data

US 2007/0256633 A1    Nov. 8, 2007

(51) Int. Cl.
*B05C 13/02* (2006.01)
*H01L 21/027* (2006.01)
*H01L 21/44* (2006.01)

(52) U.S. Cl. .................... 156/345.21; 156/345.17; 134/104.1

(58) Field of Classification Search ............ 156/345.11, 156/345.21, 345.17; 134/902, 52, 88, 104.1, 134/119, 95.2, 102.1, 102.2, 102.3
See application file for complete search history.

(56) References Cited

U.S. PATENT DOCUMENTS

| 6,210,481 B1 * | 4/2001 | Sakai et al. | 118/697 |
| 6,357,457 B1 * | 3/2002 | Taniyama et al. | 134/57 R |
| 7,479,205 B2 * | 1/2009 | Okuda et al. | 156/345.18 |

* cited by examiner

*Primary Examiner*—Sylvia R. MacArthur
(74) *Attorney, Agent, or Firm*—Birch, Stewart, Kolasch & Birch, LLP

(57) ABSTRACT

A semiconductor apparatus for processing a wafer comprises a stage, a fluid supply unit, and a cleaning unit. The stage supports the wafer. The fluid supply unit provides a first fluid, wherein the fluid supply unit is moveable between a second position and a first position. The cleaning unit provides a second fluid, wherein when the fluid supply unit is in the first position, the fluid supply unit provides the first fluid toward the wafer, and when the fluid supply unit is in the second position, the cleaning unit blows the second fluid toward a surface of the fluid supply unit to clean the surface thereof.

18 Claims, 11 Drawing Sheets

US 7,635,417 B2

SEMICONDUCTOR APPARATUS AND CLEANING UNIT THEREOF

BACKGROUND OF THE INVENTION

1. Field of the Invention

The invention relates to a cleaning unit, and in particular to a cleaning unit for a fluid supply unit of a semiconductor apparatus.

2. Description of the Related Art

FIG. 1a shows a conventional semiconductor apparatus 1, which comprises a spin chuck 13, a pipe 17 and a nozzle 216. The nozzle 16 is connected to the pipe 17. A wafer W is placed on the spin chuck 13, and the nozzle 16 and the pipe 17 apply a chemical liquid thereto. With reference to FIG. 1b, when the chemical liquid 18 is applied to the wafer W, the spin chuck 13 rotates the wafer W, and the chemical liquid 18 on the wafer 18 sputters by centrifugal force. The sputtered chemical liquid 18 adheres to a surface of the pipe 17. With reference to FIG. 1c, as chemical liquid 18 accumulates on the surface of the pipe 17, the chemical liquid (pollutant) 18 drops to the wafer W. The wafer W is polluted, because the chemical liquid 18 is aged or contains particles.

BRIEF SUMMARY OF THE INVENTION

A semiconductor apparatus for processing a wafer comprises a stage, a fluid supply unit, and a cleaning unit. The stage supports the wafer. The fluid supply unit provides a first fluid, wherein the fluid supply unit is moveable between a first position and a second position. The cleaning unit provides a second fluid, wherein when the fluid supply unit is in the first position, the fluid supply unit provides the first fluid toward the wafer, and when the fluid supply unit is in the second position, the cleaning unit blows the second fluid toward a surface of the fluid supply unit to cleaning the surface thereof.

The invention removes pollutant from the surface of the fluid supply unit. The wafer is, thus prevented from polluted, and reliability of the final product is improved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
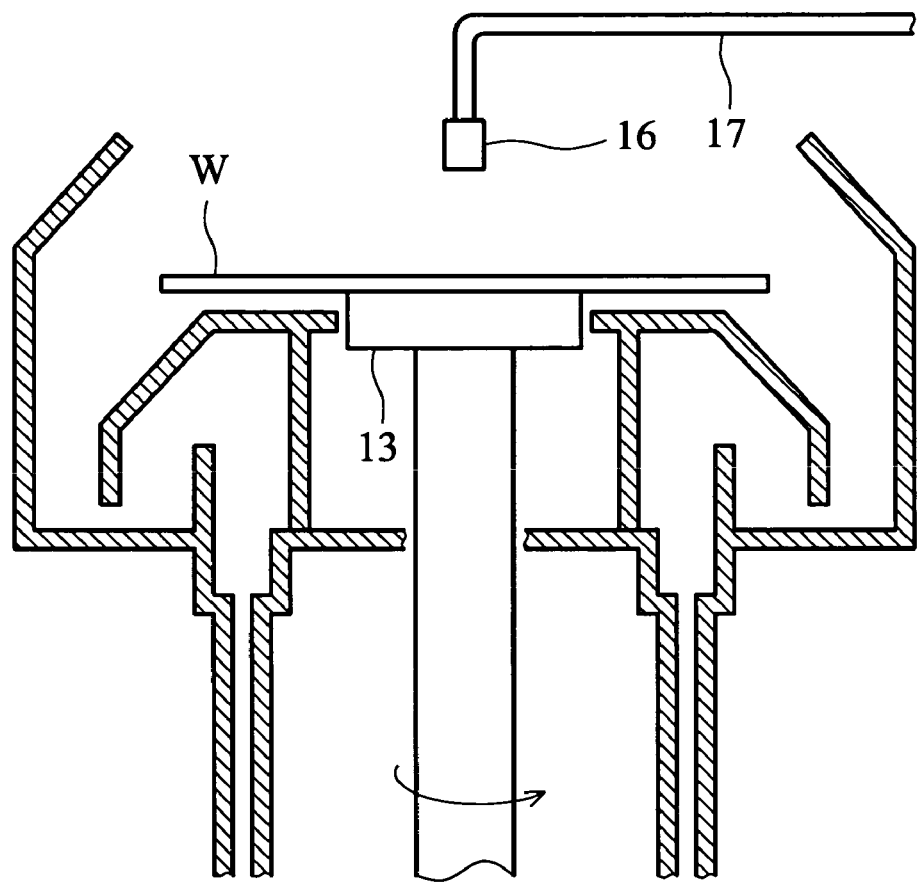
FIG. 1a shows a conventional semiconductor apparatus.
Figure 1B:
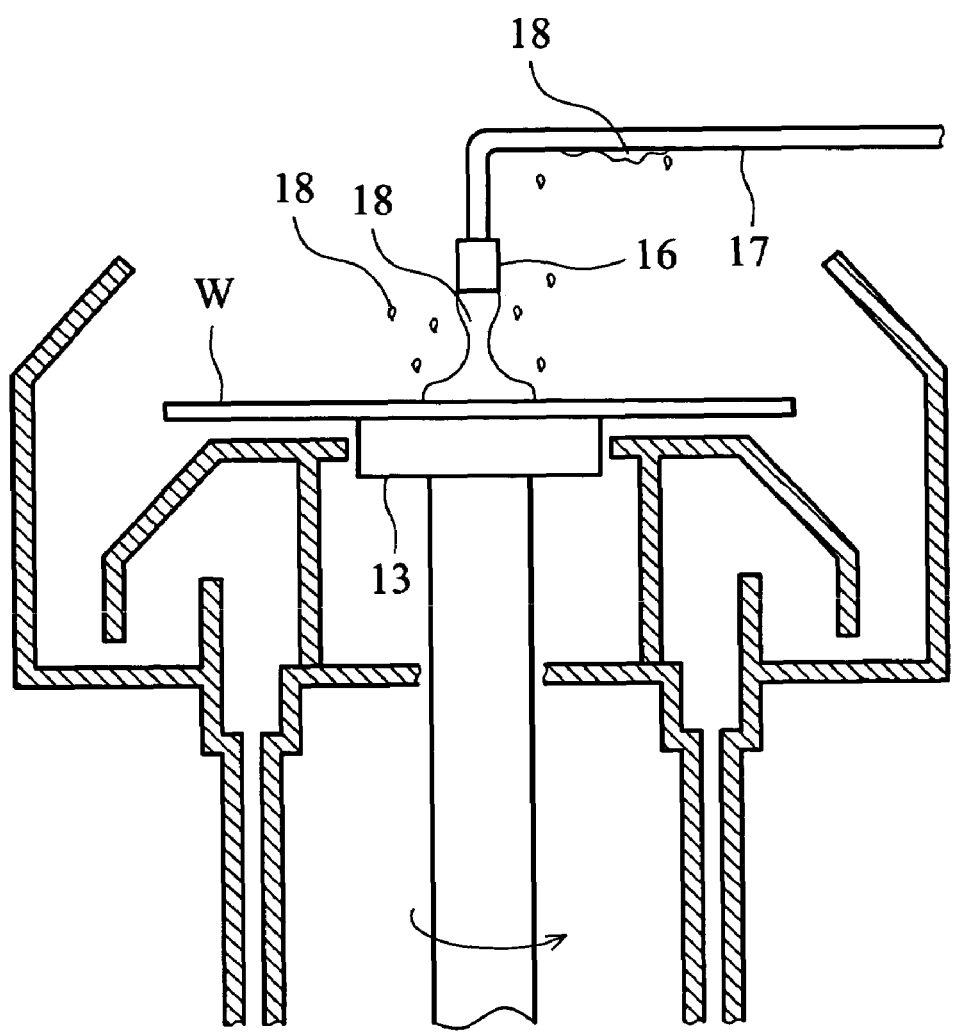
FIG. 1b shows pollutant on a surface of the conventional semiconductor apparatus.
Figure 1C:
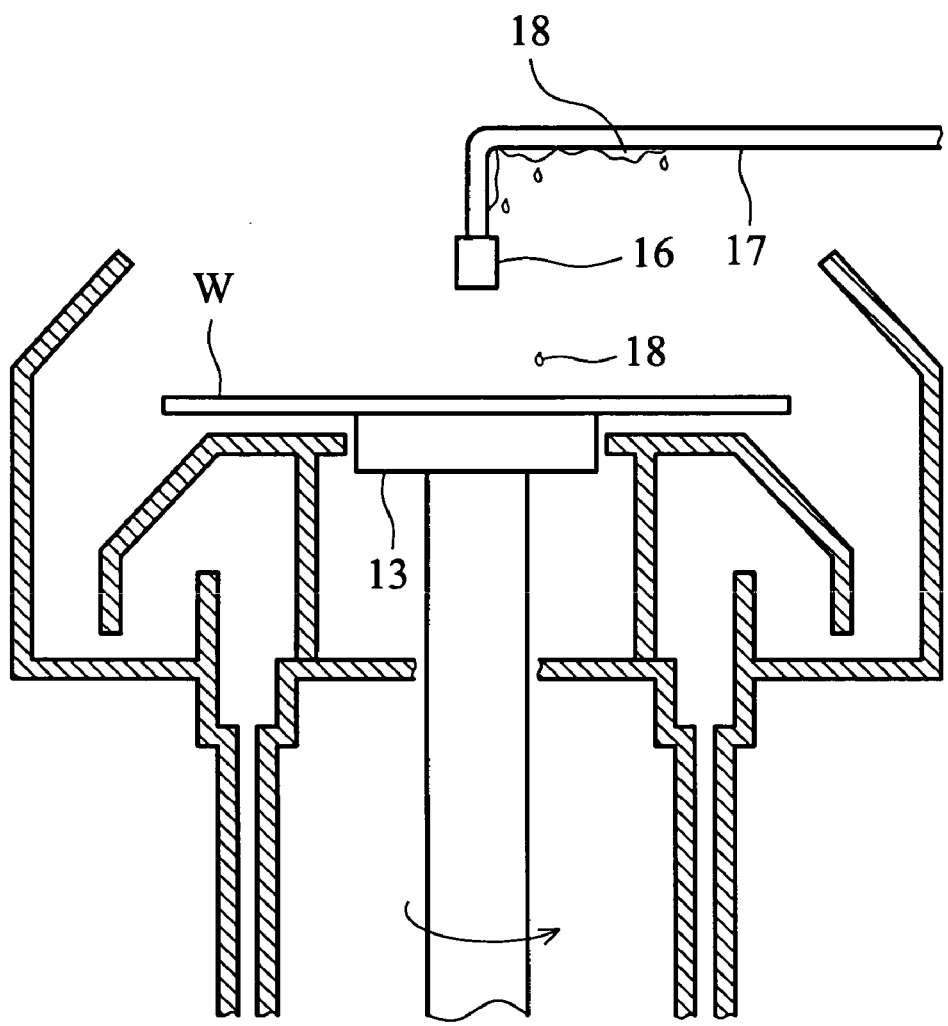
FIG. 1c shows pollutant polluting a wafer in the conventional semiconductor apparatus.
Figure 2A:
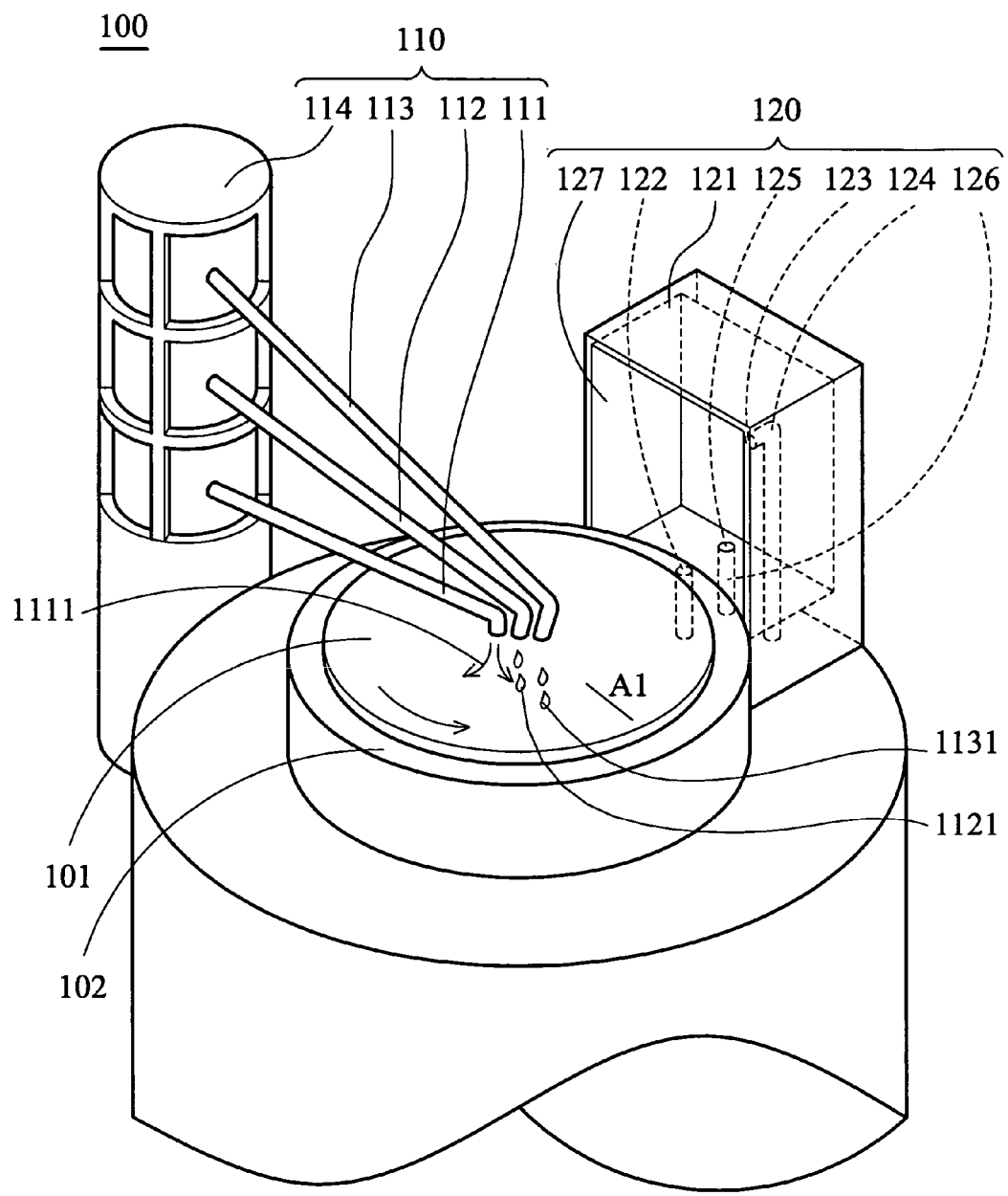
FIG. 2a shows a first embodiment of the invention, wherein pipes thereof are in a first position.

FIG. 2a shows a semiconductor apparatus 100 of a first embodiment of the invention, which comprises a stage 102, a fluid supply unit 110 and a cleaning unit 120. A wafer 101 is supported and rotated by the stage 102. The fluid supply unit 110 comprises a first pipe 111, a second pipe 112, a third pipe 113 and a pivot element 114. The first pipe 111, the second pipe 112 and the third pipe 113 are connected to the pivot element 114. The cleaning unit 120 comprises a chamber 121, an outlet 122, a first exhaust opening 123 and a second exhaust opening 125. The first exhaust opening 123 is connected to a negative pressure pipe 124, and the second exhaust opening 125 is connected to an exhaust pipe 126. The chamber 121 comprises an entrance 127.

When the first pipe 111, the second pipe 112 and the third pipe 113 are in a first position A1, the first pipe 111 provides dry nitrogen 1111 toward the wafer 101, the second pipe 112 provides DI water 1121 toward the wafer 101, and the third pipe 113 provides etcher 1131 toward the wafer 101 to process the wafer 101.

In the first embodiment of the invention, the semiconductor apparatus 100 wet etches the wafer to remove polymer therefrom after a dry etching process.

Figure 2B:
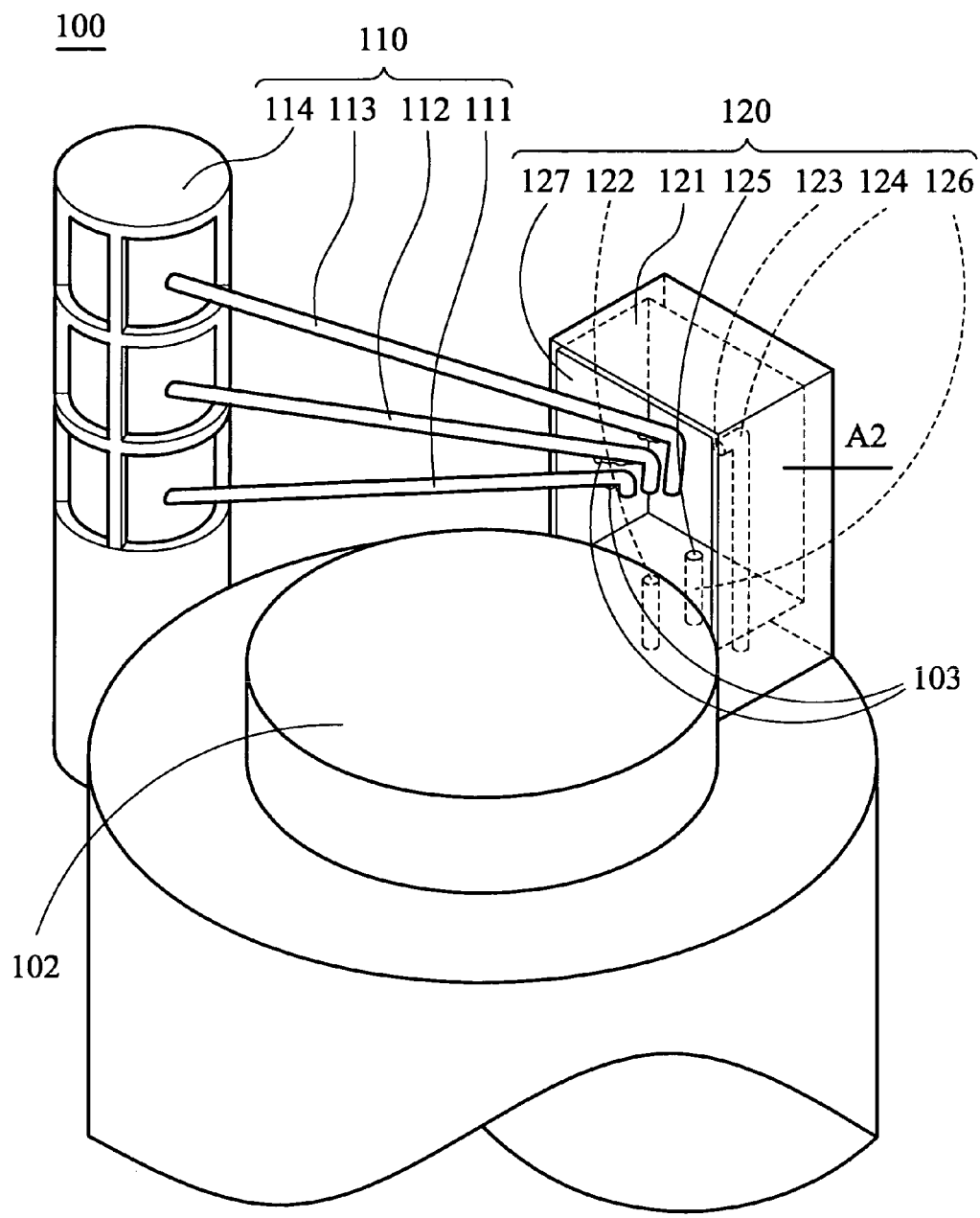
FIG. 2b shows pipes of the first embodiment in a second position.

As shown in FIG. 2b, after the wafer is processed, the first pipe 111, the second pipe 112 and the third pipe 113 are moved (or rotated) to a second position A2 in the chamber 121 through the entrance 127, with pollutant 103 on the surfaces of the first pipe 111, the second pipe 112 and the third pipe 113.

Figure 2C:
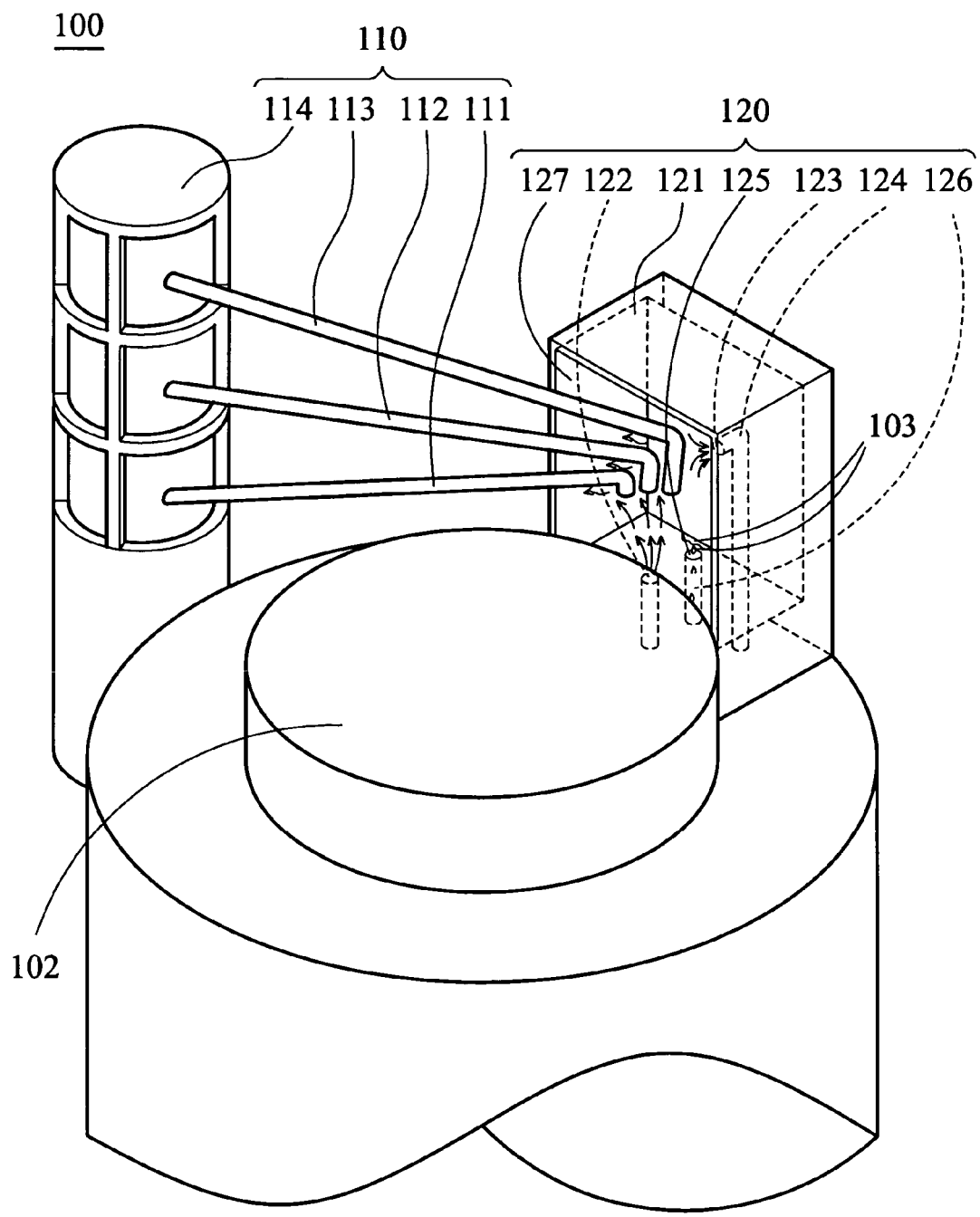
FIG. 2c shows a cleaning unit cleaning the pipes.

With reference to FIG. 2c, the outlet 125 blows dry air toward the first pipe 111, the second pipe 112 and the third pipe 113 to remove pollutant 103 therefrom. The air in the chamber 121 is then expelled through the first exhaust opening 123 and the negative pressure pipe 124. The pollutant 103 is moved to the bottom of the chamber 121, and expelled out of the chamber through the second exhaust opening 125.

The cleaning unit 120 is of anti-static electricity material.

The invention removes pollutant from the surface of the fluid supply unit. The wafer is thus kept clean, and reliability of the final product is improved.

Figure 3:
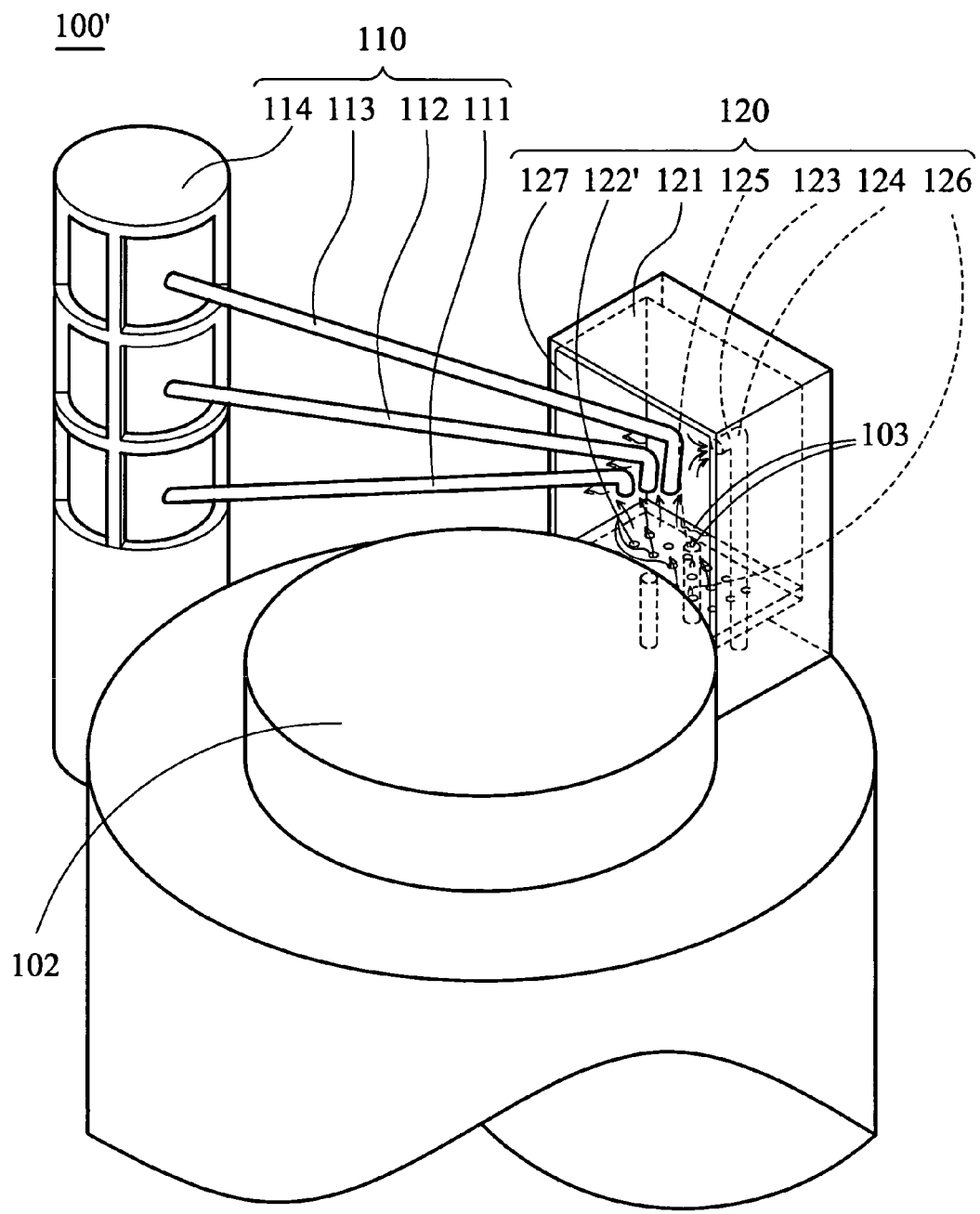
FIG. 3 shows a second embodiment of the invention.

FIG. 3 shows a semiconductor apparatus 100' of a second embodiment of the invention, which comprises a stage 102, a fluid supply unit 110 and a cleaning unit 120. A wafer 101 is supported and rotated by the stage 102. The fluid supply unit 110 comprises a first pipe 111, a second pipe 112, a third pipe 113 and a pivot element 114. The first pipe 111, the second pipe 112 and the third pipe 113 are connected to the pivot element 114. The cleaning unit 120 comprises a chamber 121, a plurality of outlets 122', a first exhaust opening 123 and a second exhaust opening 125. The first exhaust opening 123 is connected to a negative pressure pipe 124, and the second exhaust opening 125 is connected to an exhaust pipe 126. The chamber 121 comprises an entrance 127.

In the second embodiment of the invention, the outlets 122' are arranged in a matrix on the bottom of the chamber 121 to provide a uniform flow field.

Figure 4:
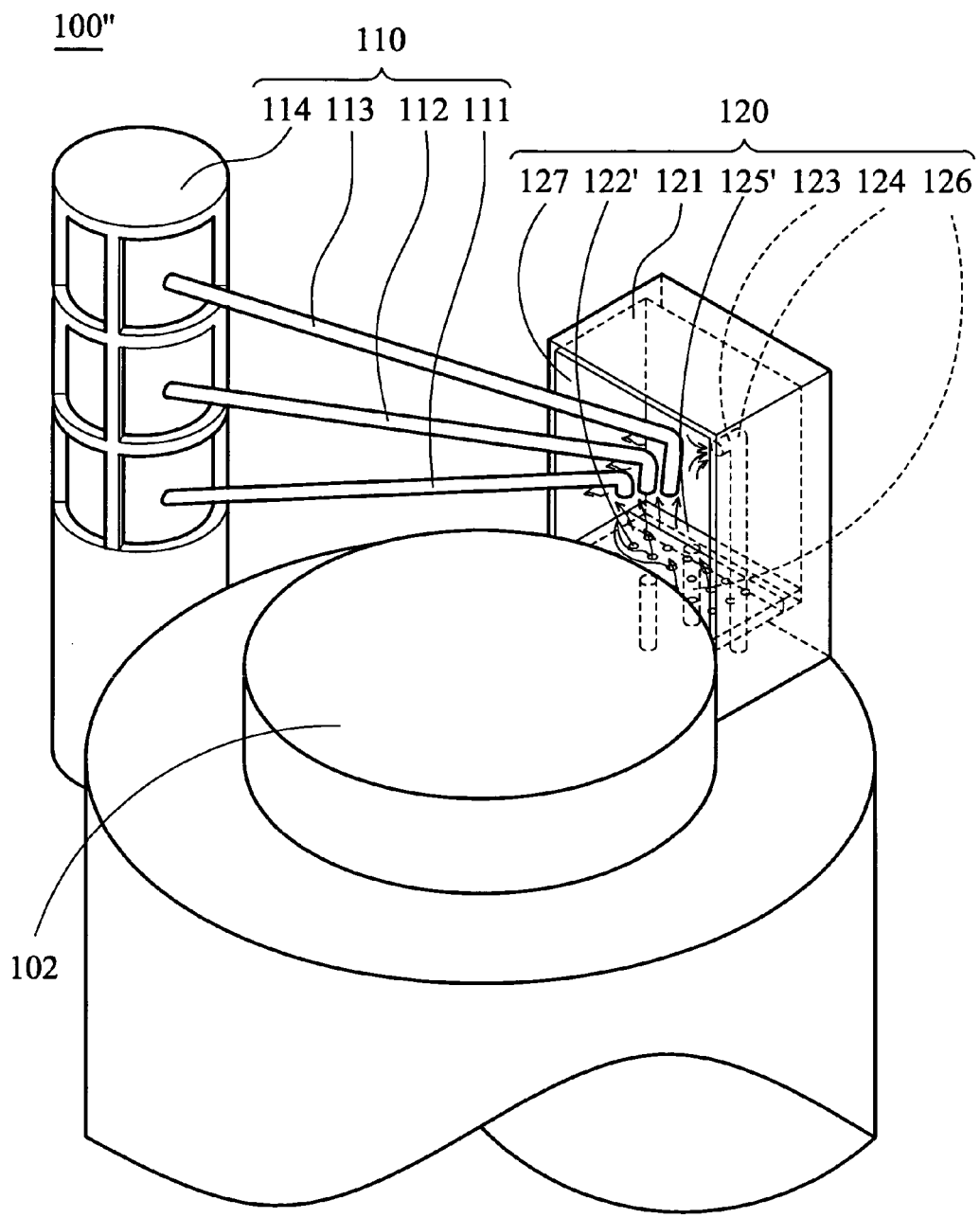
FIG. 4 shows a third embodiment of the invention.

FIG. 4 shows a semiconductor apparatus 100" of a third embodiment of the invention, which comprises a stage 102, a fluid supply unit 110 and a cleaning unit 120. A wafer 101 is supported and rotated by the stage 102. The fluid supply unit 110 comprises a first pipe 111, a second pipe 112, a third pipe 113 and a pivot element 114. The first pipe 111, the second pipe 112 and the third pipe 113 are connected to the pivot element 114. The cleaning unit 120 comprises a chamber 121, a plurality of outlets 122', a first exhaust opening 123 and a second exhaust opening 125'. The first exhaust opening 123 is connected to a negative pressure pipe 124, and the second exhaust opening 125' is connected to an exhaust pipe 126. The chamber 121 comprises an entrance 127. In the third embodiment of the invention, the second exhaust opening 125' is longitudinal to exhaust the pollutant.

Figure 5:
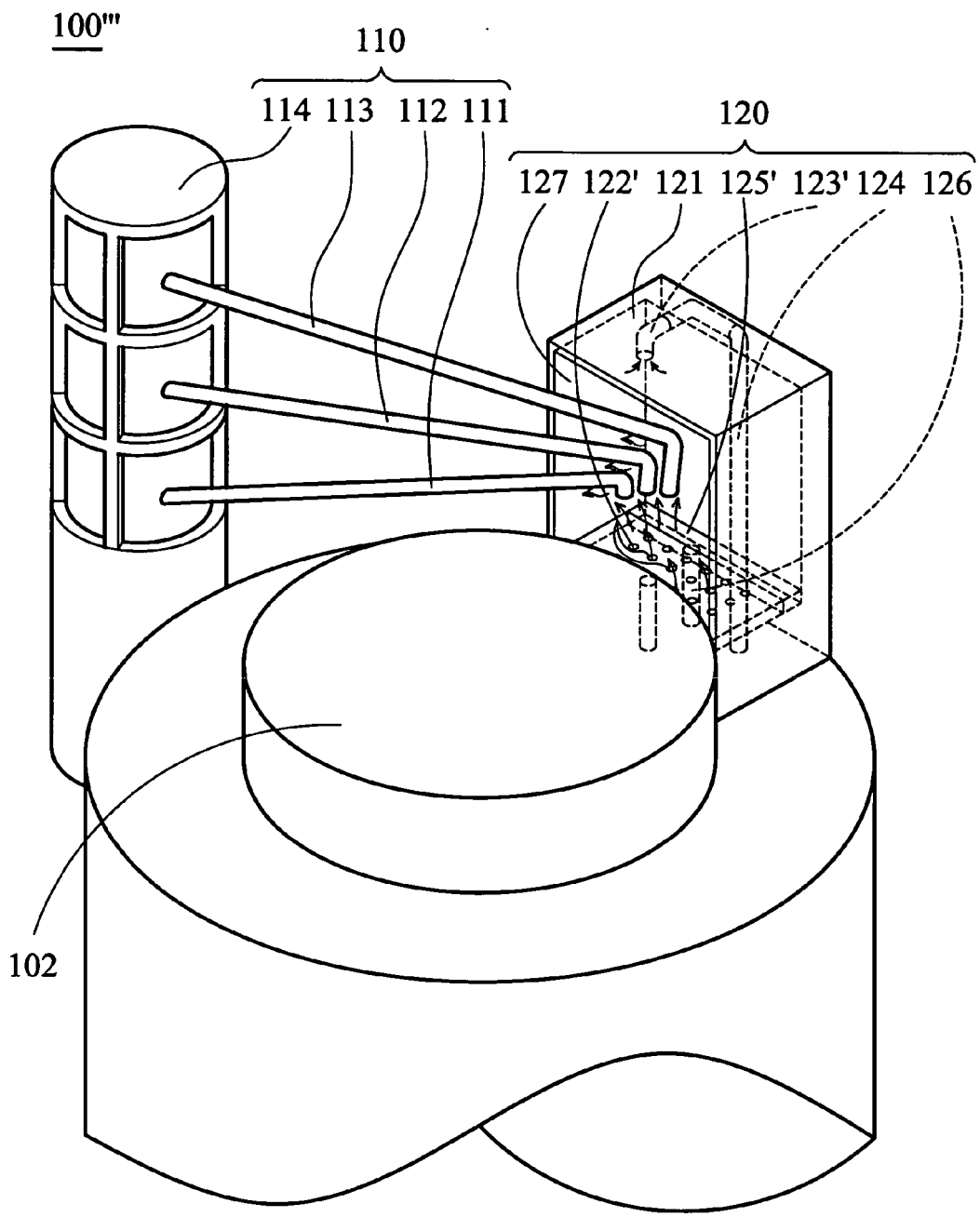
FIG. 5 shows a fourth embodiment of the invention.

FIG. 5 shows a semiconductor apparatus 100''' of a fourth embodiment of the invention, which comprises a stage 102, a fluid supply unit 110 and a cleaning unit 120. A wafer 101 is supported and rotated by the stage 102. The fluid supply unit 110 comprises a first pipe 111, a second pipe 112, a third pipe 113 and a pivot element 114. The first pipe 111, the second pipe 112 and the third pipe 113 are connected to the pivot element 114. The cleaning unit 120 comprises a chamber 121, a plurality of outlets 122', a first exhaust opening 123' and a second exhaust opening 125'. The first exhaust opening 123' is connected to a negative pressure pipe 124, and the second exhaust opening 125' is connected to an exhaust pipe 126. The chamber 121 comprises an entrance 127.

In the fourth embodiment of the invention, the first exhaust opening 123' is located on the top of the chamber 121 to provide a uniform flow field.

Figure 6A:
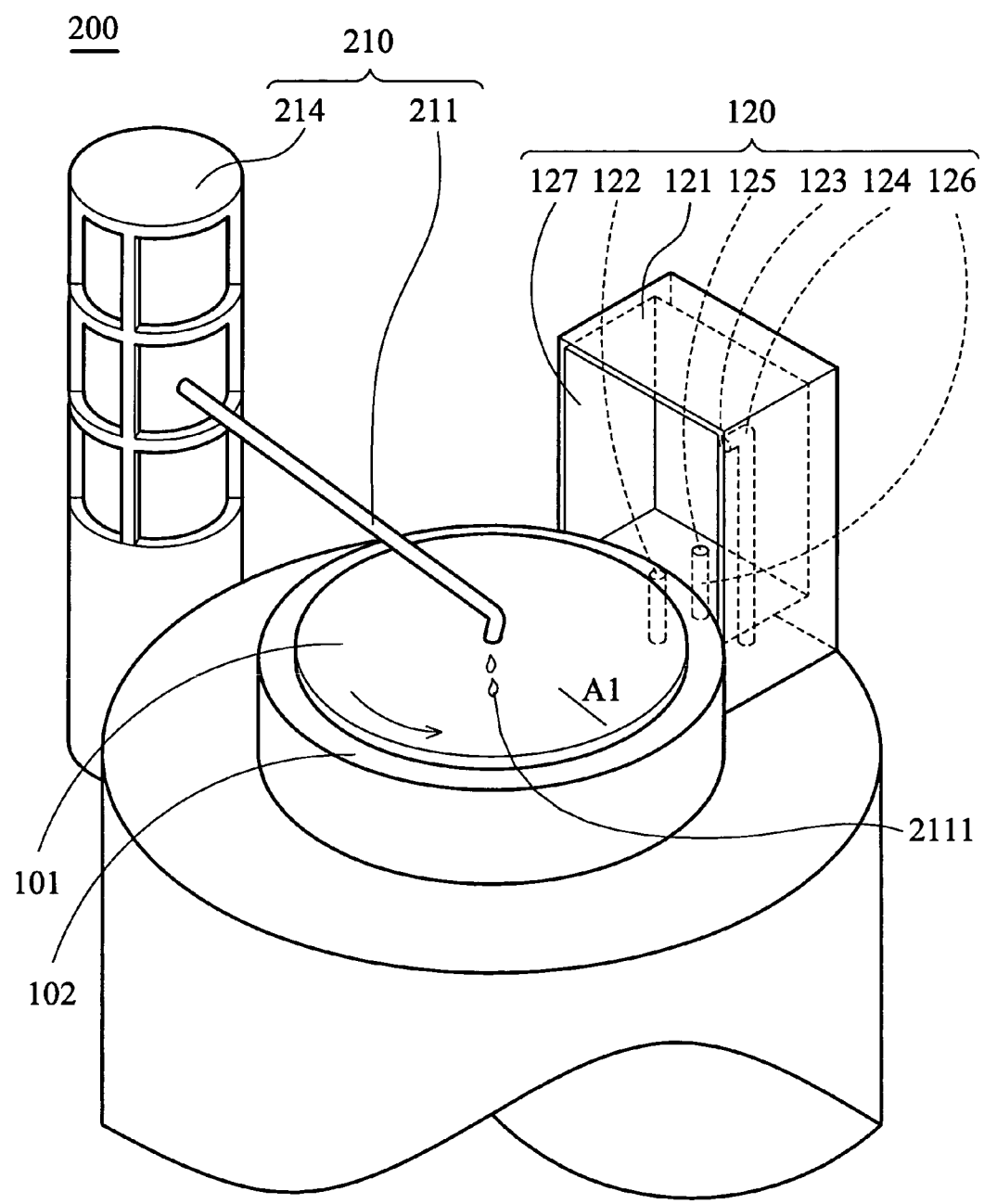
FIG. 6a shows a fifth embodiment of the invention, wherein a pipe thereof is in a first position.

FIG. 6a shows a semiconductor apparatus 200 of a fifth embodiment of the invention, which comprises a stage 102, a fluid supply unit 210 and a cleaning unit 120. A wafer 101 is supported and rotated by the stage 102. The fluid supply unit 210 comprises a fourth pipe 211 and a pivot element 214. The fourth pipe 211 is connected to the pivot element 214. The cleaning unit 120 comprises a chamber 121, a outlet 122, a first exhaust opening 123 and a second exhaust opening 125. The first exhaust opening 123 is connected to a negative pressure pipe 124, and the second exhaust opening 125 is connected to an exhaust pipe 126. The chamber 121 comprises an entrance 127.

When the fourth pipe 211 is in a first position A1, the fourth pipe 211 provides photoresist toward the wafer 101 to coat a photoresist layer on the wafer 101.

In the fifth embodiment of the invention, the semiconductor apparatus 200 coats a photoresist layer on the wafer.

Figure 6B:
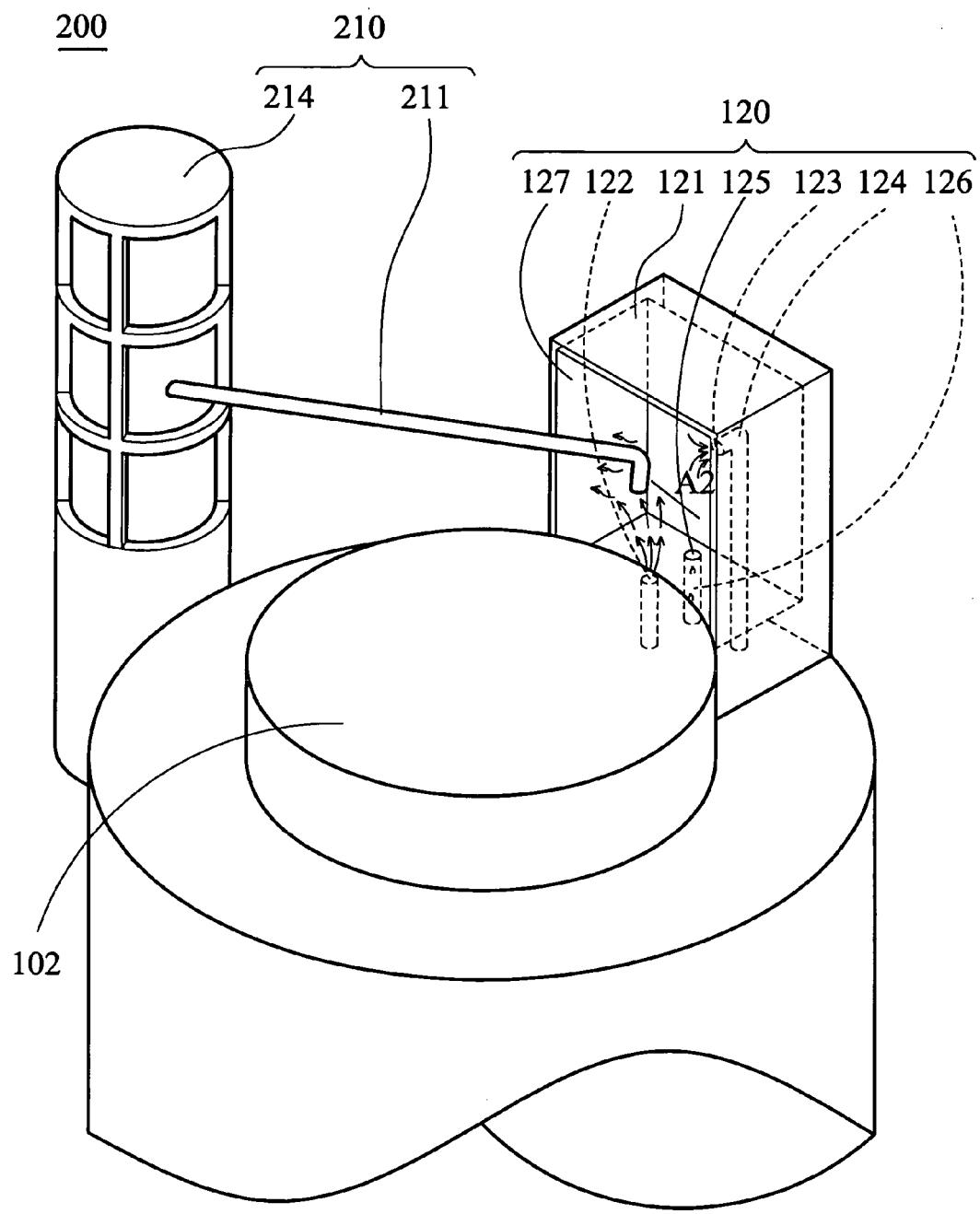
FIG. 6b shows the pipe of the fifth embodiment in a second position.

With reference to FIG. 6b, when the fourth pipe 211 is in a second position A2 in the chamber 121, the outlet 125 blows dry air toward the fourth pipe 211 to remove pollutant 103 therefrom. The air in the chamber 121 is then expelled through the first exhaust opening 123 and the negative pressure pipe 124. The pollutant is moved to the bottom of the chamber 121, and expelled out of the chamber through the second exhaust opening 125.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor apparatus for processing a wafer, comprising: a stage supporting the wafer; a fluid supply unit, providing a first fluid, wherein the fluid supply unit comprises a fluid supply pipe and a pivot element, the fluid supply pipe is connected to the pivot element and pivotable between a first position and a second position; and a cleaning unit having a lateral entrance, the lateral entrance being an opening facing the stage wherein, when the fluid supply pipe is in the first position, the fluid supply pipe provides the first fluid toward the wafer and when the fluid supply pipe is in the second position, the fluid supply pipe enters into the cleaning unit through the lateral entrance and is located in the cleaning unit, and the cleaning unit cleans a surface of the fluid supply pipe, wherein the cleaning unit comprises a chamber with the lateral entrance, an outlet and a first exhaust opening, the outlet and the first exhaust opening disposed in the chamber, and when the fluid supply unit is in the second position, the fluid supply unit is located in the chamber; wherein the cleaning unit further comprises a second exhaust opening and an exhaust pipe, the second exhaust opening disposed in the chamber, the exhaust pipe connected to the second exhaust opening, and wherein pollutant is removed from the chamber through the second exhaust opening and the exhaust pipe.

2. The semiconductor apparatus as claimed in claim 1, wherein the cleaning unit further comprises a negative pressure pipe connected to the first exhaust opening.

3. The semiconductor apparatus as claimed in claim 1, wherein the chamber comprises an entrance, and the fluid supply pipe moves between the first position and the second position through the entrance.

4. The semiconductor apparatus as claimed in claim 1, wherein the first exhaust opening is disposed in an upper portion 0f the chamber.

5. The semiconductor apparatus as claimed in claim 1, wherein the second exhaust opening is disposed in a bottom of the chamber.

6. The semiconductor apparatus as claimed in claim 1, wherein the second exhaust opening is longitudinal.

7. The semiconductor apparatus as claimed in claim 1, wherein the chamber comprises anti-static electricity material.

8. The semiconductor apparatus as claimed in claim 1, wherein the first fluid is etcher.

9. The semiconductor apparatus as claimed in claim 1, wherein the first fluid is DI water.

10. The semiconductor apparatus as claimed in claim 1, wherein the cleaning unit provides dry air.

11. The semiconductor apparatus as claimed in claim 10, wherein the dry air is blown toward the surface of the fluid supply unit from the outlet to remove pollutant therefrom, and the dry air is removed from the chamber through the first exhaust opening.

12. The semiconductor apparatus as claimed in claim 1, wherein the semiconductor apparatus cleans the wafer.

13. The semiconductor apparatus as claimed in claim 1, wherein the semiconductor apparatus coats a photoresist layer upon the wafer.

14. The semiconductor apparatus as claimed in claim 13, wherein the first fluid is photoresist.

15. The semiconductor apparatus as claimed in claim 1, wherein when the wafer is processed, the stage rotates the wafer.

16. The semiconductor apparatus as claimed in claim 1, wherein the cleaning unit comprises a chamber, a plurality of outlets and a first exhaust opening, the outlets and the first exhaust opening disposed in the chamber, and when the fluid supply unit is in the second position, the fluid supply unit is located in the chamber.

17. The semiconductor apparatus as claimed in claim 16, wherein the outlets are arranged in a matrix on a bottom of the chamber.

18. The semiconductor apparatus as claimed in claim 1, wherein the opening faces a direction substantially perpendicular to a top surface of the stage.

* * * * *